United States Patent [19]

Wood

[11] Patent Number: 5,705,905
[45] Date of Patent: Jan. 6, 1998

[54] SOURCE IMPEDANCE MEASUREMENT FOR MOTOR CONTROL

[75] Inventor: Richard D. Wood, Plymouth, Minn.

[73] Assignee: Baldor Electric Company, Plymouth, Minn.

[21] Appl. No.: 683,673

[22] Filed: Jul. 17, 1996

[51] Int. Cl.⁶ .................................................. G01R 31/36
[52] U.S. Cl. ............................ 318/490; 324/153; 324/771
[58] Field of Search ................................ 318/490, 565;
324/522, 525, 691, 713, 771, 153; 340/514,
515; 364/801, 802

[56] References Cited

U.S. PATENT DOCUMENTS 3,976,868  8/1976  Lane .
4,042,830  8/1977  Kellenbenz et al. .
5,329,222  7/1994  Gyugyi et al. .
5,345,200  9/1994  Reif .

Primary Examiner—Bentsu Ro
Attorney, Agent, or Firm—Arnold, White & Durkee

[57] ABSTRACT

A power inverter assembly for a three-phase motor includes a resistor of known resistance which is capable of being switched in between the positive and negative DC bus lines that supply power to the power control electronics. When the resistor is switched in, a voltage drop across the bus lines is observed. The magnitude of this voltage drop is then used to determine a percent impedance value which indicates whether the source impedance is sufficient.

32 Claims, 2 Drawing Sheets

SOURCE IMPEDANCE MEASUREMENT FOR MOTOR CONTROL

FIELD OF THE INVENTION

This invention relates generally to the field of electric motors, and more particularly relates to power sources for electric motors.

BACKGROUND OF THE INVENTION

Three-phase motors, as well as power inverters and pulse-width modulated controls for such motors, are well-known in the art. The power inverter assembly for a pulse-width modulated motor control typically contains a diode bridge, a bus capacitor, and power control electronics. Some power inverter assemblies also contain a so-called "brake resistor" for providing a current path across the bus system when the motor is being stopped.

A three-phase power supply can be modeled as a pure voltage source and an equivalent source impedance, $Z_S$. If a power supply's source impedance is less than a predetermined value as compared with the standard load for which the source is rated, the root-mean-square (RMS) diode current in the motor control becomes excessive. This excess heating current can damage the diode bridge.

On the other hand, if the source impedance is sufficient, the problem of heating will not arise.

SUMMARY OF THE INVENTION

The present invention is directed to a method and apparatus for measurement and verification of power source impedance.

In one embodiment of the invention, an inverter assembly for a three-phase motor includes a resistor of known resistance which is capable of being switched in between the positive and negative DC bus lines that supply power to the power control electronics. When the resistor is switched in, a voltage drop across the bus lines is observed. The magnitude of this voltage drop is then used to determine a percent impedance value which indicates whether the source impedance is sufficient.

BRIEF DESCRIPTION OF THE DRAWINGS

Various aspects of the present invention may be best appreciated with reference to a detailed description of a specific embodiment of the invention, when read in conjunction with the accompanying drawings, wherein.

DETAILED DESCRIPTION OF A SPECIFIC EMBODIMENT OF THE INVENTION

Figure 1:
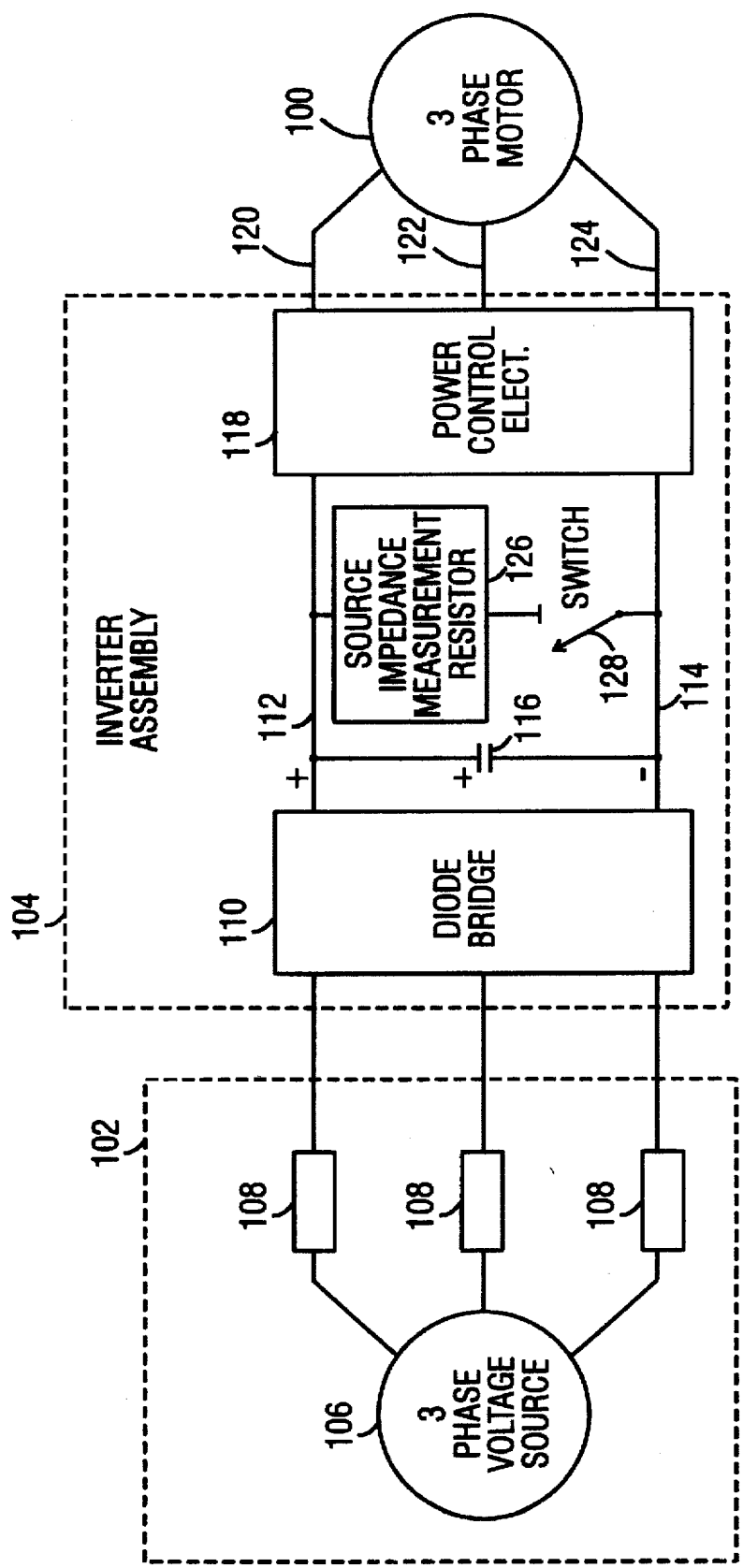
FIG. 1 is a block diagram of a motor system in accordance with one embodiment of the invention.

FIG. 1 is a simplified block diagram of a motor system in accordance with one embodiment of the present invention. The system of FIG. 1 includes a three-phase motor 100, a three-phase power source 102, and a power inverter assembly 104.

Power source 102 is depicted in FIG. 1 as comprising a pure voltage source 106 and an equivalent series impedance represented by the resistors 108.

Inverter assembly 104, which is disposed between power source 102 and motor 100, includes a diode bridge 110 for converting the alternating-current (AC) power from power source 102 to a direct-current (DC) signal carried on positive bus line 112 and negative bus line 114. A bus capacitor 116 is disposed between bus lines 112 and 114, in a conventional arrangement. Bus lines 112 and 114 are applied to power control electronic circuitry 118 which applies pulse-width modulated power to the windings of motor 100 on lines 120, 122, and 124, in accordance with well-known principles of three-phase motor control. Pulse-width modulated motor control circuits are common and well-understood. The details of the design and operation of power control electronics 118 in FIG. 1 are not considered relevant for the purposes of an understanding of the present invention, and hence will not be discussed herein.

In accordance with one aspect of the invention, inverter assembly 104 further comprises a source impedance measurement resistor 126 and a switch 128 disposed in series between bus lines 112 and 114. As will be hereinafter described in further detail, resistor 126 and switch 128 are used to measure the impedance of voltage source 102.

The impedance of voltage source 102 is measured in accordance with one embodiment of the invention by measuring the maximum DC voltage between bus lines 112 and 114 twice, once "loaded," i.e., with switch 128 closed to couple resistor 126 between bus lines 112 and 114, and once "unloaded," i.e., with switch 128 open. This yields two measured values, VLLWL and VLLNL from which a voltage difference ΔV can be computed (as VLLNL-VLLWL).

Figure 2:
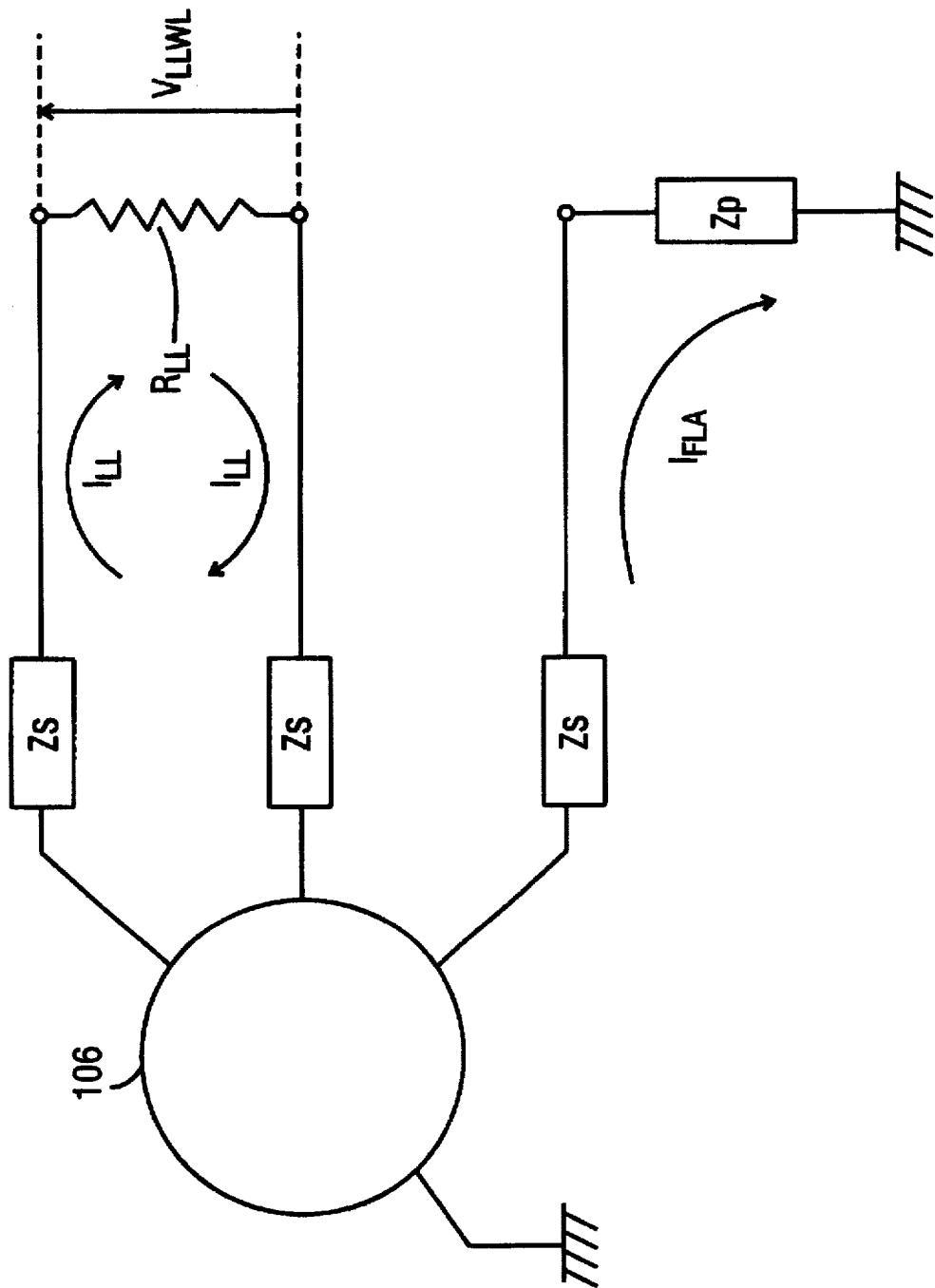
FIG. 2 is a block diagram of the power supply from the motor system of FIG. 1.

The manner in which the source impedance is determined in accordance with the presently disclosed embodiment of the invention may be best appreciated by first considering the effect of loading the power source before it is applied to diode bridge 110. A specific example of this is depicted in FIG. 2, which shows a line-to-line load resistor RLL coupled between two lines of the three-phase power source 106. Prior to the addition of RLL, the no-load RMS line-to-line voltage VLLNL is measured. Then, the loaded RMS line-to-line voltage VLLWL is measured.

The effective series impedance ZS (resistors 108 in FIG. 1) can be computed as follows: Given that the no-load voltage VLLNL is known, using Ohm's law the following Equation 1 describes the loaded situation, where a current ILL flows through two of the effective series impedances ZS and through the known load RLL:

$$V_{LLNL} - I_{LL} \cdot 2 Z_S - I_{LL} \cdot R_{LL} = 0 \qquad \text{(Eqn. 1)}$$

where $$I_{LL} = \frac{V_{LLWL}}{R_{LL}} \qquad \text{(Eqn. 2)}$$

These equations reduce to:

$$\Delta V = V_{LLNL} - V_{LLWL} = \frac{2 \cdot V_{LLWL} \cdot Z_S}{R_{LL}} \qquad \text{(Eqn. 3)}$$

such that $$Z_S = \frac{R_{LL}}{2 V_{LL}} \cdot \Delta V \qquad \text{(Eqn. 4)}$$

Likewise, according to Ohm's law, and given that a line-to-line voltage is larger than a line-to-neutral voltage by a factor of the square root of three, the effective load impedance $Z_L$ in FIG. 2 is given by:

$$Z_L = \frac{V_{LLNL}}{\sqrt{3} \cdot I_{FLA}} \quad \text{(Eqn. 5)}$$

where $I_{FLA}$ is the full load amperage of power source 106.

Finally, given $Z_S$ and $Z_L$, a percentage impedance ("PI") value, representing the ratio of actual equivalent series impedance to rated load impedance is given by:

$$PI = 100 \cdot \frac{Z_S}{Z_L} \quad \text{(Eqn. 6)}$$

In accordance with one embodiment of the invention, similar principles can be applied to determine the PI by observing the voltage drop across DC bus lines 112 and 114 on the other side of the diode bridge when resistor 126, with a resistance $R_{SIM}$ is switched in by closing switch 128.

First, consider the PI expressed in terms of the expression for $Z_S$ from Equation 4 above, as follows:

$$PI = \frac{Z_S}{Z_L} \cdot 100 = \frac{\left(\frac{R_{LL} \cdot \Delta V}{2 \cdot V_{LLWL}}\right)}{(Z_L)} \times 100 \quad \text{(Eqn. 7)}$$

Solving this for $\Delta V$ and knowing that $V_{LLWL}/R_{LL}=I_{LL}$, it follows that:

$$\Delta V = 2 \times \left(\frac{PI}{100} \cdot Z_L\right) \times I_{LL} \quad \text{(Eqn. 8)}$$

where, as before:

$$Z_L = \frac{V_{LLNL}}{\sqrt{3} \cdot I_{FLA}} \quad \text{(Eqn. 9)}$$

One factor must be taken into account when applying Equation 8 to the circuit of FIG. 1, where the voltage drop is observed on the other side of diode bridge 110 than in the circuit of FIG. 2. In particular, it must be noted that the effective value of a sinusoidal signal is the maximum value divided by the square root of two. Hence, a current $I_{SIM}$, which flows through resistor 126, will be substituted for $I_{LL}$ Equation 8, where $I_{SIM}$ is given by:

$$I_{SIM} = \frac{\sqrt{2} \cdot V_{LLWL}}{R_{SIM}} \quad \text{(Eqn. 10)}$$

Solving Equations 8, 9 and 10 for PI yields:

$$PI = 50 \sqrt{\frac{3}{2}} \cdot \frac{I_{FLA} \cdot R_{SIM}}{V_{LL}^2} \cdot \Delta V \approx 61 \cdot \frac{I_{FLA} \cdot R_{SIM}}{V_{LL}^2} \cdot \Delta V \quad \text{(Eqn. 11)}$$

Those of ordinary skill in the art will appreciate, however, that the coefficient 61 in Equation 11 is not valid, because the relationship between the phase current from power source 106 and the bus current on bus lines 112 and 114 is not a linear one.

Therefore, empirically:

$$PI = K \cdot \frac{I_{FLA} \cdot R_{SIM}}{V_{LL}^2} \cdot \Delta V \quad \text{(Eqn. 12)}$$

where the coefficient K must be determined as a function of known circuit parameters on a case by case basis. The PI can then be defined as a function of bus voltage drop including the parametric variables unique to each inverter model. In particular, the full load amperage ($I_{FLA}$), source impedance measurement resistance ($R_{SIM}$), line-to-line voltage ($V_{LL}$), and percent impedance (PI) parameters must be determined.

Equation 12 can be simplified by defining normalized resistance (NR) and normalized voltage drop (NVD) quantities, as follows:

$$NR = \frac{R_{SIM}}{\frac{V_{LL}}{\sqrt{2} \cdot I_{FLA}}} \quad \text{(Eqn. 13)}$$

$$NVD = \frac{\Delta V}{\sqrt{2} \cdot V_{LL}} \quad \text{(Eqn. 14)}$$

so that Equation 12 can be expressed as:

$$PI = K \times NR \times NVD \quad \text{(Eqn. 15)}$$

From the foregoing, it should be apparent that a method and apparatus for assessing the impedance of a power source has been disclosed. The method involves measuring the change in the DC bus voltage in a power inverter when a known load is coupled between the bus lines. The observed change can be correlated to source impedance according to a formula involving a constant coefficient K that is determined for a given implementation of the invention.

It is contemplated that the measurements in accordance with the present invention may be made manually, or automatically by circuitry included in a power inverter. Likewise, the computations necessary to obtain a percentage impedance value in accordance with the present invention can be performed manually or automatically, for example, by a microprocessor included in or associated with the power inverter.

It is believed that those of ordinary skill in the art having fie benefit of the present disclosure would be readily able to implement circuitry for practicing the present invention. For example, those of ordinary skill in the art would appreciate that the present invention may be implemented using a microprocessor or dedicated hardware system included in a power inverter, which circuitry would be responsible for opening and closing switch 128, and for taking the various voltage measurements necessary to obtain the percentage impedance value as described above.

In applications where the source impedance assessment in accordance with the presently disclosed embodiment of the invention is performed automatically, for example upon startup of the motor, it is contemplated that if the resulting PI value is less than a predetermined value, for example, 3, a warning or other alarm can be issued to alert the operator of the need for supplemental impedance. Alternatively, a system including circuitry for carrying out an impedance measuring method in accordance with the present invention can be designed to automatically cut off the motor (for example, by decoupling it from the power supply) should the PI value fall out of range, in order to avoid damage to the system. In such an embodiment, it may be desirable for the impedance measurement procedure to be performed at regular, periodic intervals during the operation of the motor.

Although a specific embodiment of the invention has been described wherein in some detail, it will be appreciated that this has been done solely for the purposes of illustrating various aspects of the invention, and is not intended to be limiting with respect to the scope of the invention.

It is contemplated that various substitutions, alterations, and/or modifications, including but not limited to those design variants and alternative implementations specifically mentioned herein, may be made to the disclosed embodiment without departing from the spirit and scope of the invention, as defined in the appended claims.

What is claimed is:

1. A power inverter assembly for an electric motor, comprising:
    a diode bridge, coupled to power lines from a power source and adapted to convert alternating current carried on said power lines to direct current carried on a positive bus line and a negative bus line;
    a bus capacitor coupled between said positive and negative bus lines; and
    a resistor of known resistance value, selectively coupled between said positive and negative bus lines, such that when said resistor is coupled between said positive and negative bus lines, the magnitude $\Delta V$ of a resultant voltage drop between said positive and negative bus lines can be observed and correlated with impedance of said power source.

2. A power inverter assembly in accordance with claim 1, further comprising motor control circuitry, coupled to said positive and negative bus lines, for receiving said direct current and supplying power to said electric motor.

3. A power inverter assembly in accordance with claim 2, wherein said motor control circuitry provides pulse-width modulated power to said electric motor.

4. A power inverter assembly in accordance with claim 1, wherein said power source is a three-phase alternating current power supply.

5. A power inverter assembly in accordance with claim 1, wherein said voltage drop magnitude $\Delta V$ is correlated with said power source impedance according to the formula:

$$PI = K \cdot \frac{I_{FLA} \cdot R_{SIM}}{V_{LL}^2} \cdot \Delta V$$

where: PI represents equivalent series source impedance as a percentage of load impedance, $I_{FLA}$ is the full load amperage of said power source, $R_{SIM}$ is the resistance value of said resistor, $V_{LL}$ is the line-to-line voltage of said power source, and K is a constant coefficient.

6. A power inverter assembly in accordance with claim 5, further comprising a microprocessor for performing said correlation.

7. A power inverter assembly in accordance with claim 5, further comprising circuitry for turning off said motor in response to calculation of a PI value below a predetermined minimum value.

8. A power inverter assembly in accordance with claim 5, wherein said constant coefficient K is determined as a function of known circuit parameters on a case-by-case basis.

9. A power inverter assembly in accordance with claim 1, further comprising a microprocessor for performing said correlation.

10. A power inverter assembly in accordance with claim 1, further comprising circuitry for turning off said motor from said power source in response to a correlation indicating that said power source impedance is below a predetermined minimum level.

11. A power inverter assembly in accordance with claim 1, wherein said voltage drop magnitude $\Delta V$ is correlated with said power source impedance according to the formula:

$$PI = K \times NR \times NVD$$

where: PI represents the equivalent series impedance as a percentage of load impedance, K is a constant coefficient determined as a function of known circuit parameters on a case-by-case basis, NR is a normalized expression of the resistance of said resistor, and NVD is a normalized expression of $\Delta V$.

12. A power inverter assembly in accordance with claim 11, wherein NR is given by:

$$NR = \frac{R_{SIM}}{\frac{V_{LL}}{\sqrt{2} \cdot I_{FLA}}}$$

where $I_{FLA}$ is the full load amperage of said power source, $R_{SIM}$ is the resistance value of said resistor, and $V_{LL}$ is the line-to-line voltage of said power source.

13. A power inverter assembly in accordance with claim 12, wherein NVD is given by:

$$NVD = \frac{\Delta V}{\sqrt{2} \cdot V_{LL}}.$$

14. A method of assessing the impedance of a power source coupled to a power inverter assembly having a diode bridge, coupled to power lines from said power source and adapted to convert alternating current carried on said power lines to direct current carded on a positive bus line and a negative bus line, said method comprising the steps of:
    (a) coupling a resistor of known resistance value between said positive and negative bus lines;
    (b) measuring the magnitude of a voltage drop between said positive and negative bus lines resulting from said step (a) of coupling; and
    (c) correlating said voltage drop with said impedance.

15. A method in accordance with claim 14, wherein said power source is a three-phase alternating current power supply.

16. A method in accordance with claim 14, wherein said voltage drop magnitude $\Delta V$ is correlated with said power source impedance according to the formula:

$$PI = K \cdot \frac{I_{FLA} \cdot R_{SIM}}{V_{LL}^2} \cdot \Delta V$$

where: PI represents the equivalent series source impedance as a percentage of load impedance, $I_{FLA}$ is the full load amperage of said power source, $R_{SIM}$ is the resistance value of said resistor, $V_{LL}$ is the line-to-line voltage of said power source, and K is a constant coefficient.

17. A method in accordance with claim 16, wherein said constant coefficient K is determined as a function of known circuit parameters on a case-by-case basis.

18. A method in accordance with claim 14, wherein said voltage drop magnitude $\Delta V$ is correlated with said power source impedance according to the formula:

$$PI = K \times NR \times NVD$$

where: PI represents the equivalent series source impedance as a percentage of load impedance, K is a constant coefficient determined as a function of known circuit parameters on a case-by-case basis, NR is a normalized expression of the resistance of said resistor, and NVD is a normalized expression of $\Delta V$.

19. A method in accordance with claim 18, wherein NR is given by:

$$NR = \frac{R_{SIM}}{\frac{V_{LL}}{\sqrt{2} \cdot I_{FLA}}}$$

where $I_{FLA}$ is the full load amperage of said power source, $R_{SIM}$ is the resistance value of said resistor, and $V_{LL}$ is the line-to-line voltage of said power source.

20. A method in accordance with claim 19, wherein NVD is given by:

$$NVD = \frac{\Delta V}{\sqrt{2} \cdot V_{LL}}.$$

21. A motor system, comprising:
a power source;
a power inverter assembly including a diode bridge coupled to power lines from said power source and adapted to convert AC voltage carried on said power lines to DC voltage carried on a positive bus line with respect to a negative bus line;
a bus capacitor coupled between said positive and negative bus lines; and
a resistor of known resistance value, selectively coupled between said positive and negative bus lines, such that when said resistor is coupled between said positive and negative bus lines, the magnitude $\Delta V$ of a resultant voltage drop between said positive and negative bus lines can be observed and correlated with impedance of said power source.

22. A motor system in accordance with claim 21, further comprising motor control circuitry, coupled to said positive and negative bus lines, for receiving said DC voltage and supplying power to an electric motor.

23. A motor system in accordance with claim 22, wherein said motor control circuitry provides pulse-width modulated power to said electric motor.

24. A motor system in accordance with claim 21, wherein said voltage drop magnitude $\Delta V$ is correlated with said power source impedance according to the formula:

$$PI = K \cdot \frac{I_{FLA} \cdot R_{SIM}}{V_{LL}^2} \cdot \Delta V$$

where: PI represents the percentage difference between actual source impedance and rated source impedance, $I_{FLA}$ is the full lead amperage of said power source, $R_{SMI}$ is the resistance value of said resistor, $V_{LL}$ is the line-to-line voltage of said power source, and K is a constant coefficient.

25. A motor system in accordance with claim 24, further comprising a microprocessor for performing said correlation.

26. A motor system in accordance with claim 24, further comprising circuitry for turning off said motor in response to calculation of a PI value below a predetermined minimum value.

27. A motor system in accordance with claim 24, wherein said constant coefficient K is determined as a function of known circuit parameters on a case-by-case basis.

28. A motor system in accordance with claim 21, further comprising a microprocessor for performing said correlation.

29. A motor system in accordance with claim 21, further comprising circuitry for turning off said motor in response to a correlation indicating that said power source impedance is below a predetermined minimum level.

30. A motor system in accordance with claim 21, wherein said voltage drop magnitude $\Delta V$ is correlated with said power source impedance according to the formula:

$$PI = K \times NR \times NVD$$

where: PI represents the equivalent series source impedance as a percentage of load impedance, K is a constant coefficient determined as a function of known circuit parameters on a case-by-case basis, NR is a normalized expression of the resistance of said resistor, and NVD is a normalized expression of $\Delta V$.

31. A motor system in accordance with claim 30, wherein NR is given by:

$$NR = \frac{R_{SIM}}{\frac{V_{LL}}{\sqrt{2} \cdot I_{FLA}}}$$

where $I_{FLA}$ is the full load amperage of said power source, $R_{SIM}$ is the resistance value of said resistor, and $V_{LL}$ is the line-to-line voltage of said power source.

32. A motor system in accordance with claim 31, wherein NVD is given by:

$$NVD = \frac{\Delta V}{\sqrt{2} \cdot V_{LL}}.$$

* * * * *